United States Patent [19]

Zaferes

[11] 4,309,240

[45] Jan. 5, 1982

[54] PROCESS FOR CHEMICAL VAPOR DEPOSITION OF FILMS ON SILICON WAFERS

[75] Inventor: Constantine J. Zaferes, Santa Clara, Calif.

[73] Assignee: Advanced Crystal Sciences, Inc., San Jose, Calif.

[21] Appl. No.: 150,555

[22] Filed: May 16, 1980

[51] Int. Cl.³ .......................................... C30B 25/10
[52] U.S. Cl. ................................. 156/611; 156/613
[58] Field of Search .............. 156/611, 613, DIG. 64; 422/245; 427/95; 264/81; 148/175; 118/715, 726

[56] References Cited

U.S. PATENT DOCUMENTS

| | | | |
|---|---|---|---|
| 3,471,326 | 10/1969 | Kappelmeyer et al. | 156/611 |
| 3,637,434 | 1/1972 | Nakanuma et al. | 156/611 |
| 4,203,387 | 5/1980 | McMullen et al. | 156/611 |
| 4,211,182 | 7/1980 | Ranowski | 156/611 |

OTHER PUBLICATIONS

Technical Digest, No. 11, Jul. 1968, Western Electric Co., Inc., Whitner.

Primary Examiner—Hiram Bernstein
Attorney, Agent, or Firm—Thomas R. Berthold

[57] ABSTRACT

A process for depositing films of uniform thickness on silicon wafers at a uniform deposition rate among all wafers processed at the same time. The wafers are vertically oriented and arranged in a spaced-apart mutually parallel fashion and are supported within a horizontally-oriented long quartz tube which is evacuated at one end by a vacuum pump. A heating element surrounding the tube heats the wafers supported within it. At least one type of reactant gas is introduced into the enclosure in a generally confined region below the wafers and between the wafer arrangement and a wall of the enclosure. The gas, which is directed upwards between adjacent wafers and dispersed across the entire surface of the wafers, chemically reacts to deposit a uniform film on the wafers. Unreacted and exhaust gases are evacuated from the enclosure by the vacuum pump in a horizontal direction of flow above the wafer arrangement.

8 Claims, 3 Drawing Figures

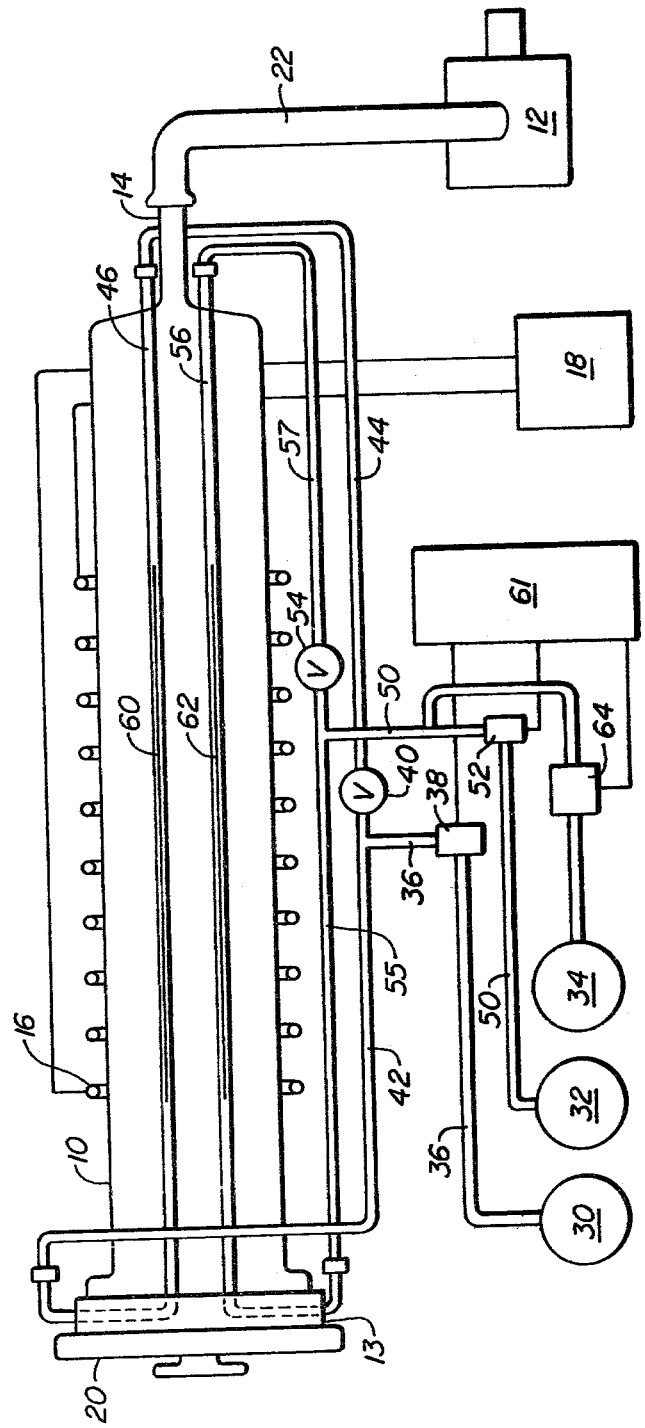
FIG._1.

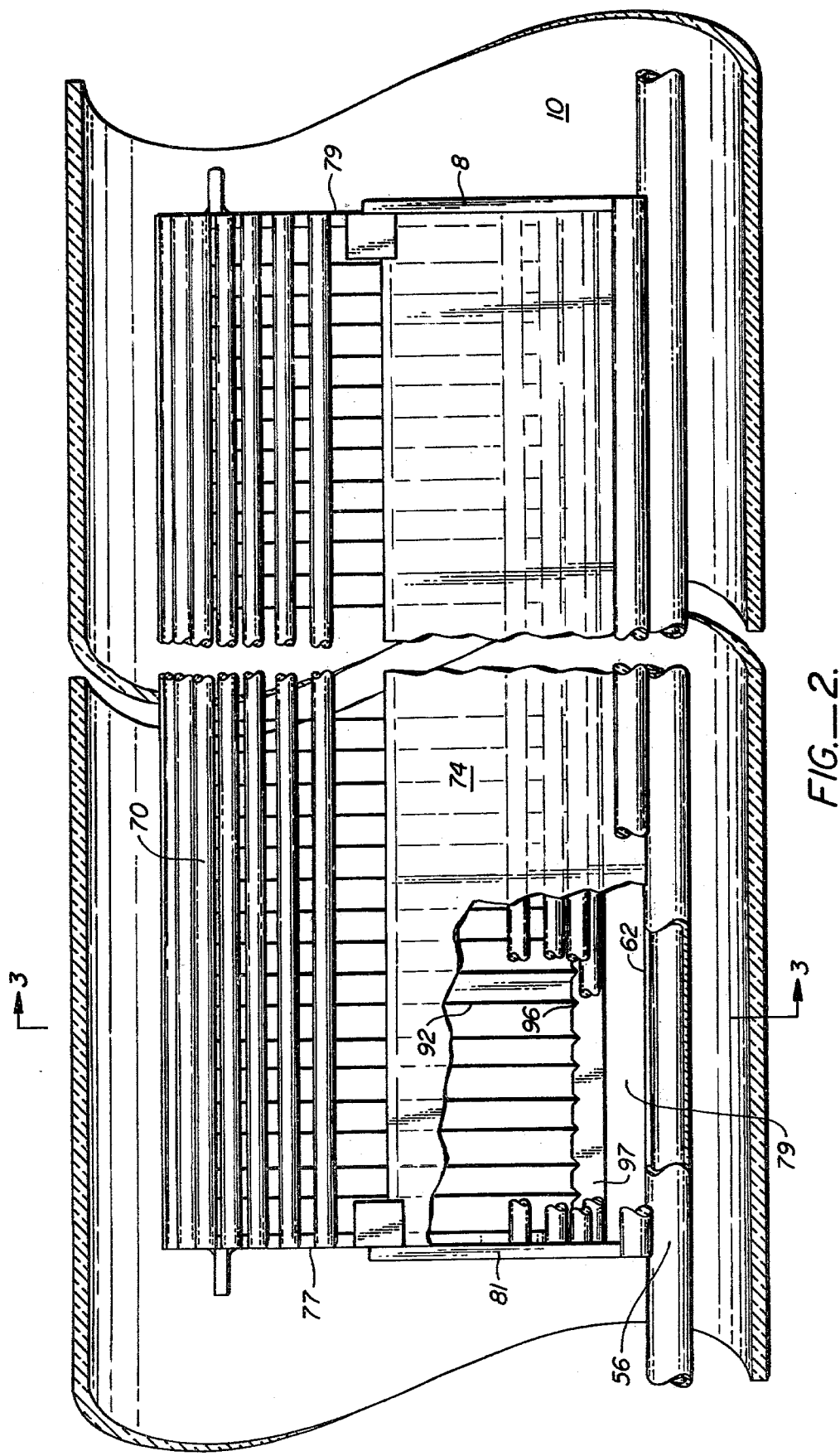

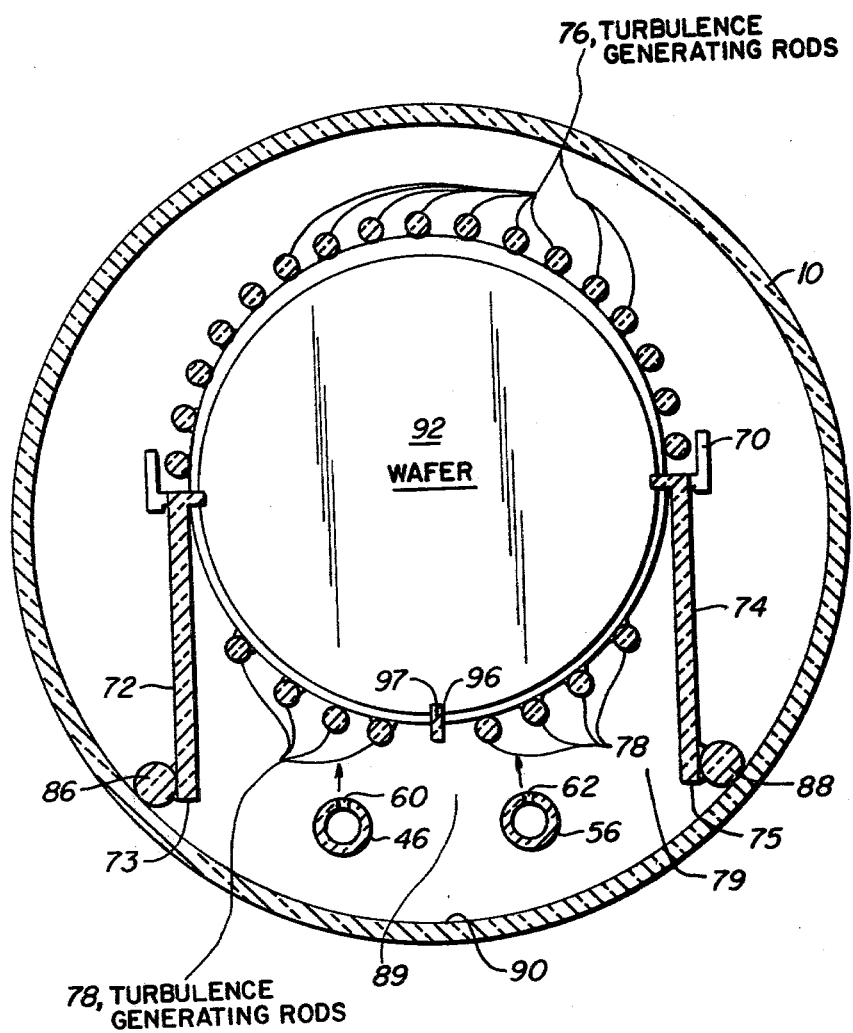
FIG._3.

PROCESS FOR CHEMICAL VAPOR DEPOSITION OF FILMS ON SILICON WAFERS

BACKGROUND OF THE INVENTION

This invention is a process relating to the fabrication of integrated circuits, and more specifically to the chemical vapor deposition of thin films on the silicon wafers which serve as the substrate of the circuits.

In the fabrication of integrated circuits, several hundred circuits are formed side-by-side on a single silicon wafer which has been cut from a long single crystal of silicon. Thin films of various materials which serve as the active circuit elements are deposited on the silicon wafer at various stages of the fabrication process. After each film is deposited on the wafer, certain portions of the film are selectively removed, usually by photolithography, so that only a predetermined pattern of the film remains.

A conventional method for forming the various thin films on the wafers is by chemical vapor deposition. In this process, the wafers are placed in a "boat" in a spaced-apart mutually parallel arrangement. The boat containing the wafers is inserted into a long quartz tube which is evacuated at the exit end by means of a vacuum pump. The quartz tube is surrounded by a cyclindrical heating element which directs thermal radiation into the interior of the tube to heat the wafers. A reactant gas introduced at one end of the tube is forced to flow toward the exit end of the tube because of the vacuum pump. As the gas passes the wafers, a chemical reaction occurs and a product of that reaction is deposited as a film on the wafers. In many instances more than one reactant gas is introduced so that a product of a chemical reaction between the two gases is deposited as a film on the wafers.

This conventional process for the chemical vapor deposition of films on silicon wafers has several inherent disadvantages. Because the silicon wafers occupy only a relatively small part of the evacuated tube, considerable reactant gas must be introduced, only a portion of which is necessary to form the thin film.

Since the gas is passing through the tube in a direction perpendicular to the wafer surfaces on which the film is to be deposited, the gas flow is interrupted and unpredictable flow characteristics are generated within the tube. It is only because of a changing flow direction caused by the silicon wafers that gas is forced to travel between adjacent wafers and thus into contact with the wafer surfaces. This unpredictable flow pattern across the wafer surfaces often results in a lack of uniform film thickness on each wafer.

The greatest localized volumetric rate of flow of gas and thus the fastest film deposition rate occurs near the first wafer contacted by the flowing gas. In contrast, the last wafer in the wafer arrangement experiences a substantially reduced rate of film deposition. In order to compensate for variations in the rate of film deposition among wafers in the boat, an inert carrier gas, such as nitrogen, is used to "carry" the reactant gas toward the exit end of the tube in order to enhance the deposition rate on the end wafers in the wafer arrangement. Additionally, since film deposition rate is a function of wafer temperature, an increasing temperature profile is created along the length of the wafer arrangement by varying the voltage to various elements of the heating elements surrounding the tube. By maintaining each wafer at a different temperature, with the temperature of the wafers increasing in the same direction of gas flow, the effect of the localized variation in volumetric gas flow rate on film deposition rate is compensated, and the rate of film deposition and thus the thickness of the deposited film is maintained relatively uniform among the wafers in the boat.

One attempt has been made to improve the conventional chemical vapor deposition process by enclosing the wafer boat in a cylindrical container having a plurality of holes on its outer surface. The end of the container facing the inlet for the reactant gas has a cover placed over it and the other end is open. As the gas enters from the inlet end of the tube, it changes direction and enters the holes in the cylindrical container where it passes between the silicon wafers. The gas is removed from the tube by passing through the open end of the container and out the exit end of the tube in a conventional manner. This process does not completely solve the problem of localized flow rate variations from one end of the wafer arrangement to the other end, and thus both a carrier gas and a temperature profile are required to create uniformity in film thickness within each wafer and from wafer to wafer.

SUMMARY OF THE INVENTION

The invention is directed to and a process for the deposition of thin films on silicon wafers in which the wafers are supported in a spaced-apart parallel arrangement within an evacuated enclosure and the reactant gas is introduced into the enclosure in a generally confined region between the wafer arrangement and the wall of the enclosure. As the reactant gas is introduced into the confined region, it is forced to flow generally parallel to and between the wafers. Prior to passing into contact with the wafer surfaces, however, turbulence is generated in the flowing gas in order to disperse the gas across the entire width of the wafer surfaces, thereby facilitating film deposition and uniform film thickness on each wafer. After the gas has passed between the wafers and chemically reacted to deposit the films on the wafers, the unreacted and exhaust gases pass to the other side of the wafer arrangement and are removed from the enclosure by flowing in a generally horizontal direction toward the exit of the enclosure. During the above-described flow of the reactant gas, the temperature of the wafers in the wafer arrangement is maintained generally constant and equal by means of heating elements located exterior of the evacuated enclosure. Because of the generally equal localized volumetric flow rates between adjacent wafers, the maintenance of the wafers at the same temperature is sufficient to permit uniform film deposition among the wafers.

In one embodiment of the invention, the reactant gas is introduced horizontally from both ends of the evacuated enclosure into the region below the wafer arrangement, and is then directed vertically upward in a gas curtain such that the localized volumetric rate of flow across the entire length of the gas curtain and thus across the entire length of the wafer arrangement is maintained generally constant, thereby resulting in generally the same volume of reactant gas being supplied to the surface of each wafer. When two reactant gases are used in the process, each gas is introduced into the confined region below the wafer arrangement. After introduction into that region, the gases chemically react with one another and a product of that reaction is deposited as a film on the wafers. In such a process, the flow rate of each reactant gas is controlled so that the ratio of total volumetric flow rate of the two gases is maintained at a predetermined value.

The apparatus for use in the above-described process comprises generally an evacuated enclosure and means for maintaining the pressure within the enclosure substantially below atmospheric, means for supporting the wafers within the enclosure such that the wafer supporting means and the lower portion of the enclosure define a generally confined region below the wafer arrangement, means for introducing the reactant gas into the confined region below the wafer arrangement and for directing the gas flow generally vertically upward, means near the lower portion of the wafer arrangement for generating turbulence in the upwardly flowing gas, and means located exterior of the enclosure for directing thermal radiation into the enclosure to heat the wafers as the gas is being introduced.

The wafer supporting means comprises generally a cylindrically shaped container having a plurality of longitudinally extending openings on its cylindrical surface which allow the gas to flow through the container in a direction generally perpendicular to its longitudinal axis and parallel to the wafer surfaces. Two parallel sidewalls extend the length of the container and project generally tangentially outward from opposite sides of the cylindrical surface of the container. When the outermost edges of the two sidewalls are placed into contact with the bottom of the evacuated enclosure, a generally confined region is defined below the wafers, which are supported inside the container. The wafers are supported inside the container in a spaced-apart mutually parallel arrangement and are oriented perpendicular to the longitudinal axis of the container. The longitudinal openings in the container, in one embodiment of the invention, are defined by long, parallel spaced-apart rods located about the cylindrical surface of the container. The rods have a circular cross-section so that as the upwardly flowing gas contacts the rods, turbulence is generated by the gas flowing around the rods and into the openings between adjacent rods. This turbulence disperses the gas and causes it to flow across the entire width of the wafer surfaces, thereby enhancing the uniformity of the thickness of the film deposited on each wafer. After the gas has passed between the wafers and approaches the rods on the other side of the cylindrical surface of the container, additional turbulence is generated to further disperse the gas across the entire width of the wafer surfaces. There is sufficient space between the container and the top of the enclosure to allow the unreacted and exhaust gases to be removed in a horizontal direction toward the exit end of the enclosure.

The means for introducing the reactant gas into the confined region below the wafers comprises generally a pair of horizontally oriented conduits extending through both ends of the evacuated enclosure and passing into the region between the wafer supporting means and the bottom of the enclosure. On each of the conduits, near the portion of the conduit located below the wafer supporting means, is a longitudinally extending slot for the exit of the reactant gas which is introduced from outside the enclosure and through the conduit. In one embodiment of the apparatus, the reactant gas is introduced from opposite ends of the conduit and then passes vertically upward through the slot as a curtain of upwardly flowing gas. When two reactant gases are required, each gas is introduced through a separate conduit.

Thus, with the present invention the reactant gas is introduced immediately into close proximity with the surfaces of the wafers and the volumetric gas flow rate near each wafer is maintained generally the same so that there is uniformity in the film thickness among the wafers. The invention thus eliminates a carrier gas and the necessity of heating the wafers in the arrangement to different temperatures, thereby reducing the amount of energy used in the process. Further, since the gas is introduced near the wafers where it immediately reacts to form the film, less reactant gas is required than in the conventional process in which large amounts of unused reactant gas are removed from the enclosure by the vacuum pump. Additionally, since the gas is dispersed and spread over the entire width of the wafer surfaces, the thickness of the film deposited on each wafer is uniform.

For a fuller understanding of the nature and advantages of the invention, reference should be made to the ensuing detailed description taken in conjunction with the accompanying drawings.

BRIEF DESCRIPTION OF THE DRAWINGS

FIG. 1 is a top view of the invention illustrating a portion of the invention in block diagram;

FIG. 2 is a side cut-away view of the evacuated enclosure on the invention disclosing the means for supporting the silicon wafers; and FIG. 3 is a view of section 3—3 of FIG. 2.

DESCRIPTION OF THE PREFERRED EMBODIMENTS

Referring first to FIG. 1, the invention compromises generally an enclosure, such as elongated quartz tube 10, means for evacuating the enclosure, such as vacuum pump 12 which is connected to tube 10 at its exit end 14, a heating element 16 surrounding tube 10 and electrically connected to a temperature controller 18 for heating the silicon wafers, means for supporting the wafers within the enclosure (FIGS. 2 and 3), and a reactant gas flow system which includes gas tanks, flow transducers, valves, and conduits for injecting the reactant gas into the interior of the enclosure.

The evacuated enclosure is preferably an elongated cylindrically shaped quartz tube which has an entrance 13 connected to a hinged door 20 and an exit 14 connected to vacuum pump 12 by means of a stainless steel conduit 22. During the film deposition process, vacuum pump 12 is operated at essentially full speed to maintain the pressure within the tube substantially below atmospheric. Heating element 16, shown in section in FIG. 1, is wrapped as a coil around tube 10, and directs thermal radiation through the radiation-permeable quartz tube 10 to heat the wafers contained inside.

The above-described quartz tube 10, heating coil 16 and its temperature controller 18, and vacuum pump 12 connected to tube 10, comprise the major portions of the apparatus used in the conventional chemical vapor deposition process on silicon wafers. In the conventional process, door 20 is opened and the silicon wafers, which are supported on a "boat" in a spaced-apart mutually parallel arrangement, are inserted into the interior of tube 10. Reactant gas which is injected through openings (not shown) in door 20, passes from entrance 13 to exit 14, and is evacuated by vacuum pump 12. During travel through tube 10, the gas passes in a direction generally perpendicular to the wafers supported in the boat. The temperature controller 18 maintains the temperature along the length of the wafer boat according to a temperature profile which increases in the direction of gas flow so that each of the wafers is heated to a temperature higher than the wafer just upstream. In this manner variations in local volumetric flow rate and thus variations in local chemical reaction rate are compensated to provide a generally uniform film thickness among the wafers within the boat. Additionally an inert carrier gas is frequently used to "carry" the reactant gas toward exit 14 of tube 10.

In the present invention, in contrast to the conventional process, the reactant gas or gases are introduced on the inside of the enclosure and are forced to flow parallel to the wafers. Referring again to FIG. 1, when only one reactant gas is used in the process, the gas from supply tank 30 passes through stainless steel tubing 36, flow transducer/valve 38, and valve 40, where it is divided into two paths, i.e. tubing 42 and 44. The gas is then directed from opposite ends of the tube 10 into quartz conduit 46 located inside tube 10. If a second reactant gas, which is contained in supply tank 32, is required, it passes through tubing 50, flow transducer/valve 52, and valve 54, where it is divided into two paths, i.e. tubing 55 and 57. The second reactant gas is then introduced from opposite ends of the tube 10 into quartz conduit 56. Conduits 46, 56 inside tube 10 serve as the means for introducing the reactant gases into the interior of tube 10 and for directing the gas generally parallel to the spaced-apart wafers in the wafer arrangement. As shown in FIG. 1, conduits 46, 56 contain elongated slots 60, 62, respectively, of constant width for introducing the gas in a direction generally parallel to the wafers in the wafer arrangement. A third gas tank 34 in the gas flow system is also operatively connected by associated stainless steel tubing to supply line 50 and includes its own flow transducer/valve 64. Tank 34 contains a dopant gas which, if required, is mixed with the second reactant gas prior to its introduction into tube 10. Each of the flow transducer/valves 38, 52, and 64 are electrically connected to a programmable flow controller 61 which permits predetermined flow rates to be selected and controlled for all of the gases. Thus, the ratio of volumetric flow rates between the first and second gases and the amount of dopant gas mixed with the second reactant gas can be preselected and controlled. Each of the transducer/valves 38, 52, and 64 is a conventional thermal mass flow controller in which the desired flow rate is selected by varying the reference voltage to an operational amplifier which controls a mechanical valve. The reference voltages are selected through programmable flow controller 61. Once the gas flow rates are selected on the programmable flow controller 61, the transducer/valves maintain the respective flow rates within a range about their respective preselected valves.

Referring now to FIGS. 2 and 3, the novel means for supporting the silicon wafers in the evacuated enclosure is illustrated. The wafer supporting means comprises generally a cylindrically-shaped container 70 which has a plurality of longitudinally extending openings spaced about its cylindrical surface and parallel side walls 72, 74, extending tangentially outward from the cylindrical surface of container 70. The edges 73, 75 of walls 72, 74, are generally in contact with the bottom of tube 10 when container 70 is placed inside tube 10 (FIG. 3). As illustrated in FIG. 2, a portion of sidewall 74 has been cut away to reveal conduit 56 within tube 10. Located behind conduit 56 in the side view of FIG. 2, is conduit 46 (not shown). In the preferred embodiment of container 70, the longitudinally extending openings in cylindrical container 70 are defined by spaced-apart rods 76 at the top portion and rods 78 at the lower portion. Rods 76 and 78 are bonded to end plates 77, 79, and an intermediate support plate (not shown), all of which are semi-circularly shaped and oriented generally parallel to the wafers. Similiarly rods 78 are bonded to end plates 81, 83, and intermediate support plate (not shown). Thus container 70 is comprised of two halves. The top half, including rods 76 secured to end plates 77, 79 is removable from the bottom half, including rods 78 secured to end plates 81, 83, so that the wafers may be placed inside. As shown in FIG. 3, the parallel side walls 72, 74, extend generally tangentially outwardly from the outer surface of container 70 and have their outermost edges, 73, 75 bonded to rods 86, 88 which are in contact with the bottom 90 of tube 10. Container 70 is preferably constructed of quartz, which has the ability to withstand high temperatures and which possesses a relatively low coefficient of thermal expansion, but any material which has these characteristics would function equally as well.

While the above described configuration is one embodiment of container 70, alternatively the wafer supporting means may be constructed of a cylindrical canister into which longitudinal openings are cut between portions of the outer wall of the canister.

It should be apparent from the above description that the region defined by bottom 90 of tube 10, the lower portion of container 70, and side walls 72, 74 is a generally confined space 89 below the parallel spaced-apart wafers retained within container 70. As shown in FIG. 3, a typical silicon wafer 92 is retained upright and oriented perpendicular to the longitudinal axis of container 70 by residing within a notch 96 in a longitudinal guide rail 97. Also depicted in FIG. 3 is the cross-sectional view of conduits 46, 56, with their respective slots 60, 62 through which the reactant gases are introduced. The elongated slots 60, 62 direct the gas vertically upward into a gas curtain within the confined region 89 beneath the wafers. It should be apparent that although the embodiment shown in the drawings illustrates the confined space 89 being located below the wafer arrangement in container 70 and discloses introducing the gas so that it flows vertically upward, the invention will function equally as well regardless of the location of space 89 within tube 10, provided that the gas introduced into space 89 is directed to flow parallel to the wafers and through the spaces between the wafers to the other side of the wafer arrangement.

The apparatus as thus described can be better understood by considering the function of the respective component parts during the process for depositing thin films on the silicon wafers. The wafers are first placed into container 70 by removing the top half and inserting the wafers into the notches on guide rail 97. The wafers as thus supported are parallel and spaced-apart in container 70, as depicted in FIG. 2. The top portion of container 70 is replaced and container 70 is inserted through open door 20 into tube 10. Container 70 with the spaced-apart wafers supported within it rests on the bottom 90 of tube 10 and the rods 86, 88 connected to side walls 72, 74 are in contact with tube bottom 90. Container 70 is inserted far enough into tube 10 so that it is directly above slots 60, 62 in conduits 46, 56, respectively. Door 20 is closed and a seal between it and tube 10 is maintained by a rubber gasket (not shown). Quartz tube 10 is then evacuated by activating vacuum pump 12 which maintains the pressure within tube 10 substantially below atmospheric. The temperature for the silicon wafers is selected by means of temperature controller 18 connected to heating element 16, which directs thermal radiation through the radiation-permeable wall of quartz tube 10 into the interior where the temperature of the wafers is elevated. A "flat" temperature profile is selected on controller 18 so that each of the wafers in the wafer arrangement is heated to essentially the same temperature. The volumetric flow rate of the reactant gas is selected by means of programmable flow controller 61 and, if two reactant gases are required, the desired flow rates of both gases are selected.

Assuming for purposes of this description of the process that silicon dioxide is to be deposited upon the silicon wafers as a dielectric isolation layer on the completed integrated circuits, the first reactant gas from tank 30 is silane ($SiH_4$), and the second reactant gas from tank 32 is oxygen ($O_2$). The programmable flow controller 61 connected to transducer/valves 38, 52 is programmed to permit the predetermined ratio of flow rates of silane and oxygen. The preselected flow rates are maintained during the process by transducer/valves 38, 52. The process is automatically activated by programmable flow controller 61 which begins the flow of gas from gas tanks 30, 32 through respective valves 40, 54 into opposite ends of respective conduits 46, 56. In the preferred embodiment valves 40, 54 are adjusted so that the gas flows at generally equal rates into both ends of conduits 46, 56, respectively. The flow is thus diverted into each of the respective paths, e.g., into tubings 42 and 44 for the silane and into tubings 55 and 57 for the oxygen. Silane passes through tubings 42, 44 in opposite directions through conduit 46 until it reaches slot 60 in conduit 46, after which it is introduced into tube 10 as a generally vertically oriented gas curtain. In a similar manner, the oxygen gas from tank 32 is split into two paths by means of valve 54 and enters conduit 56 from opposite directions until it is introduced vertically upward and parallel to the silicon wafers through slot 62. The widths of slots 60, 62 for most applications may be generally between 0.005 inches and 0.020 inches. Of course, since the widths of the slots affect the volumetric flow rates of the gases and thus the film deposition rate, once the widths are chosen, tests would be conducted to determine the proper settings for transducer/valves 38, 52. It should be noted that as the gases are being introduced into tube 10, vacuum pump 12 immediately evacuates tube 10 and maintains the pressure within it substantially below atmospheric. Simultaneously, the silicon wafers are heated by heating coil 16 which directs thermal radiation through the wall of tube 10 to raise the temperature of the wafers to a preselected valve. In establishing the initial values for the flow rates of the gases, the pressure within tube 10, the temperature of the silicon wafers, and the settings for valves 40, 54, test runs are conducted to arrive at values which give the optimum rate and uniformity of film deposition.

Referring again to FIGS. 2 and 3, the flow of gas within confined region 89 after is has exited slots 60, 62 can be better understood. As the silane and oxygen exit slots 60, 62, respectively, the gases are directed into a generally vertically oriented gas curtain below the lower portion of container 70, specifically rods 78. Because the enclosure within tube 10 is almost completely a vacuum, upon exiting slots 60, 62, the gases rapidly expand within the generally confined region 89. The gases, which are injected with an initial velocity from the slots, are directed into contact with rods 78 beneath the wafers. As the gases contact rods 78, the flow is diverted into a plurality of gas streams and turbulence is generated in the flow. The gases pass around rods 78 which disperse the gases across the width of the wafers. As turbulence is generated and the gases dispersed, the silane and oxygen are forced into contact with one another and chemically react to form silicon dioxide which is deposited upon the wafers, such as typical wafer 92, as a thin film. Because of the wide dispersion of flow across the width of the wafers caused by rods 78, uniformity in the rate of deposition across the surface of the wafers is achieved. As is better illustrated in FIG. 3, the gases which have passed rods 78, are confined to flow between adjacent wafers, or in the case of the end wafers in the arrangement, between the end wafers and end walls 77, 81, and 79, 83 of container 70. Horizontal flow within container 70 is prevented because of the end walls and the wafers. It should also be apparent that since gas is entering conduits 46, 56 from opposite directions, the localized volumetric flow rate between adjacent wafers is maintained substantially equivalent. Valves 40, 54 are used to compensate for different path lengths from the gas tanks to the opposite ends of conduits 46, 56 and may be adjusted to "fine tune" the volume of gas entering from opposite ends of the conduits in order to thereby optimize the local flow rates between wafers.

While the above-described method is the preferred one of maintaining substantially equivalent localized volumetric flow rate between adjacent wafers, it is within the scope of the invention to inject the gases from only one end of conduits 46, 56, the other ends being sealed. In this alternative method, tapered slots may be provided in conduits 46, 56 so that the widths of the resulting gas curtains vary with distance along the slots, thereby compensating for variation in the exit velocity of the gases with distance along the tapered slots. Still another alternative within the scope of the invention is to provide a plurality of orifices along the length of conduits 46, 56 and spaced so as to be aligned with the spaces between adjacent wafers. In both alternative embodiments, the dimensions of the tapered slots and the orifices, respectively, would determine the gas flow rates to be selected on transducer/valves 38, 52, in order to achieve the desired film deposition rate.

It should also be noted that since gas is substantially prevented from passing outside of confined region 89, and more specifically past walls 72, 74 (FIG. 3), a substantially lesser amount of reactant gas is required than in the coonventional process since very little reactant gas is evacuated from tube 10 without having first contacted the silicon wafers.

As the gases chemically react to deposit the silicon dioxide film on the wafers, the unreacted gases and the exhaust gases of the chemical reaction pass generally vertically upward between the wafers toward the upper portion of container 70 and into contact with rods 76. Rods 76 create additional turbulence near the upper portion of the wafers and generally interrupt the gas flow, thereby causing some back flow which provides even greater dispersion of gas across the wafers. After the gases have passed the wafers and passed between the openings between the spaced-apart rods 76, the unreacted and exhaust gases pass outside of container 70 into the area between container 70 and the upper portion of tube 10. The unreacted and exhaust gases are evacuated from the enclosure by vacuum pump 12 in a generally horizontally flow direction above container 70 towards the exit 14 of tube 10.

In order to better understand the above-described process for the deposition of silicon dioxide as a dielectric isolation layer, a typical run will be explained with particular emphasis on the values of the various parameters involved. Typically, the pressure within tube 10 is maintained at approximately 450–500 microns and the wafers are heated to approximately 400°–500° Centigrade. Silane is introduced into the tube at a flow rate of approximately 50 cubic centimeters per minute and oxygen at a flow rate of approximately 125 cubic centimeters per minute. Slots 60, 62 have a constant width of 0.010 inches in this example. With these values of pressure, temperature and gas flow rates, the above process provides a silicon dioxide film deposition rate of 400 Angstroms per minute with uniformity in film thickness within each wafer and from wafer-to-wafer of plus or minus two percent.

In the event it is desired to introduce a dopant gas in the abovedescribed process, for example to provide the silicon dioxide film with resistance to cracking or to make it easier to flow, the dopant gas, such as phosphene ($PH_3$), is mixed with the second reactant gas, i.e. oxygen, prior to the introduction of the second reactant gas into tube 10. The programmable flow controller 61 controls transducer/valve 64 so that the phosphene is mixed with the oxygen according to a predetermined ratio by weight, the respective optimum flow rates of oxygen and phosphene having been previously determined empirically.

While the process has been explained in conjunction with the deposition of a thin film of silicon dioxide as a dielectric isolation layer on the silicon wafers, it should be apparent that numerous other types of thin films can be deposited equally as well and with the same uniformity in film thickness within each wafer and among the wafers in each arrangement. For example, introducing dichlorosilane ($SiH_2Cl_2$) and nitrous oxide ($N_2O$), while maintaining the temperature of the wafers in the range of 850 to 950 degrees Centrigrade results in the deposition of silicon dioxide as the initial insulating oxide layer on the wafers. Also, if silane alone is introduced while the wafers are maintained in the range of approximately 800 degrees Centigrade, a thin film of polysilicon is deposited, the primary applications of which are as an interstitial layer and as a dielectric isolation layer. Silicon nitride and doped polysilicon are other examples of films which may be deposited.

It should now be apparent that the above invention provides a new and substantially improved apparatus and process for the deposition of thin films on silicon wafers in the fabrication of integrated circuits. Since the reactant gas is introduced in close proximity to the silicon wafers in a direction parallel to the wafers before it is dispersed across the entire width of the wafers, increased deposition rate and better uniformity of film thickness within individual wafers is achieved. Additionally, since the localized volumetric flow rate between adjacent wafers is generally the same, the uniformity in film deposition rate and in ultimate film thickness among the wafers in each wafer arrangement is also greatly improved. Because the reactant gas is introduced into a generally confined region on one side of the wafer arrangement and is then forced to flow parallel and between adjacent wafers, less reactant gas is required, the use of a carrier gas is eliminated, and the temperatures of the wafers can be maintained substantially equal, thereby minimizing the amount of energy used in the process.

While the preferred embodiments of the present invention have been illustrated in detail, it should be apparent that modifications and adaptations of those embodiments will occur to those skilled in the art. However, it is to be expressly understood that such modifications and adaptations are within the sphere and scope of the present invention as set forth in the following claims.

What is claimed is:

1. A process for the chemical vapor deposition of films on silicon wafers comprising the steps of:
    providing a substantially evacuated enclosure for the wafers and maintaining the pressure within the enclosure substantially below atmospheric;
    directing thermal radiation into the interior of the enclosure to heat the wafers;
    supporting the wafers within the enclosure in a spaced-apart mutually parallel arrangement with the central axes normal to the wafers being generally collinear and with the planes defined by the wafers being oriented vertically;
    introducing a reactant gas into the enclosure by first directing the gas horizontally from both ends of the length of the wafer arrangement simultaneously in a stream confined from the enclosure interior and then generating from said stream a single substantially vertically oriented curtain of gas flowing into the enclosure interior along the length of one side of the wafer arrangement;
    prior to the passage of the flowing gas between the wafers, generating turbulence in the flow so as to facilitate the later deposition of film on the wafers;
    after the gas has passed between the wafers and a portion of the gas has chemically reacted to deposit a film on the wafers, generating turbulence in the flow near the side of the wafer arrangement opposite the side where the gas was introduced to further facilitate the deposition of film on the wafers; and
    removing the exhaust gas from the enclosure in a generally horizontal direction of flow.

2. The process according to claim 1 including the step of preventing the gas from flowing horizontally past the two end wafers of the wafer arrangement.

3. The process according to claim 1 wherein the film to be deposited on the wafers is polysilicon and wherein the step of introducing the reactant gas includes the step of introducing silane.

4. The process according to claim 3 wherein the polysilicon film to be deposited on the wafers includes a dopant and including the step of mixing a dopant gas with the silane in a predetermined ratio by weight prior to introducing the silane.

5. A process for the chemical vapor deposition of films on silicon wafers comprising the steps of:
    providing a substantially evacuated enclosure for the wafers and maintaining the pressure within the enclosure substantially below atmospheric;
    directing thermal radiation into the interior of the enclosure to heat the wafers;
    supporting the wafers within the enclosure in a spaced-apart mutually parallel arrangement with the central axes normal to the wafers being generally collinear and with the planes defined by the wafers being oriented vertically;

introducing a first reactant gas into the enclosure by first directing the first reactant gas horizontally from both ends of the length the wafer arrangement simultaneously, and then generating a single substantially vertically oriented curtain of flowing first reactant gas along the length of one side of the wafer arrangement;

introducing a second reactant gas into the enclosure by first directing the second reactant gas horizontally from both ends of the length of the wafer arrangement simultaneously, and then generating a single substantially vertically oriented curtain of second reactant gas along the length of one side of the wafer arrangement and generally parallel to the curtain of flowing first reactant gas;

just prior to the passage of the upwardly flowing gases between the wafers, generating turbulence in the flow of the gases so as to mix the first gas with the second gas and thereby facilitate the chemical reaction of the gases and the deposition of a product of the chemical reaction as a film on the wafers;

after the gases have passed between the wafers and a portion of the gases has chemically reacted to deposit a film on the wafers, generating turbulence in the flow near the side of the wafer arrangement opposite the side where the gases were introduced to further facilitate the deposition of film on the wafers; and removing the exhaust and unreacted gases from the enclosure in a generally horizontal direction of flow.

6. The process according to claim 5 wherein the film to be deposited on the wafers is silicon dioxide, wherein the step of introducing the first reactant gas includes the step of introducing silane, wherein the step of introducing the second reactant gas includes the step of introducing oxygen, and wherein the step of directing thermal radiation includes the step of maintaining the temperature of the wafers within the range of 375–450 degrees Centigrade.

7. The process according to claim 5 wherein the film to be deposited on the wafers is silicon dioxide, wherein the step of introducing the first reactant gas includes the step of introducing dichlorosilane, wherein the step of introducing the second reactant gas includes the step of introducing nitrous oxide, and wherein the step of directing thermal radiation includes the step of maintaining the temperature of the wafers within the range of 850–950 degrees Centigrade.

8. The process according to claim 6 wherein the silicon dioxide film to be deposited includes a dopant and including the step of mixing a dopant gas with the oxygen in a predetermined ratio by weight prior to introducing the second reactant gas.

* * * * *